(12) United States Patent
Lee et al.

(10) Patent No.: US 12,721,243 B2
(45) Date of Patent: Aug. 25, 2026

(54) SEMICONDUCTOR PACKAGE

(71) Applicant: SAMSUNG ELECTRONICS CO., LTD., Suwon-si (KR)

(72) Inventors: Ji Hyun Lee, Suwon-si (KR); Han Sung Ryu, Suwon-si (KR); Jun Ho Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 359 days.

(21) Appl. No.: 18/380,361

(22) Filed: Oct. 16, 2023

(65) Prior Publication Data

US 2024/0222241 A1 Jul. 4, 2024

(30) Foreign Application Priority Data

Jan. 3, 2023 (KR) ........................ 10-2023-0000785

(51) Int. Cl.

*H10W 90/00* (2026.01)
*H10W 70/60* (2026.01)
*H10W 70/65* (2026.01)
*H10W 70/685* (2026.01)
*H10W 74/15* (2026.01)

(52) U.S. Cl.

CPC ........ *H10W 90/701* (2026.01); *H10W 70/611* (2026.01); *H10W 70/65* (2026.01); *H10W 70/685* (2026.01); *H10W 90/00* (2026.01); *H10W 74/15* (2026.01); *H10W 90/724* (2026.01); *H10W 90/734* (2026.01)

(58) Field of Classification Search

CPC ... H10W 90/701; H10W 90/00; H10W 74/15; H10W 90/724; H10W 90/734; H10W 72/30; H10W 72/851; H10W 72/20–287; H10W 70/00–699; H10W 90/721–7295; H05K 1/00–189; H05K 2203/04–0485

See application file for complete search history.

(56) References Cited

U.S. PATENT DOCUMENTS 6,285,560 B1 9/2001 Lyne
6,417,463 B1 7/2002 Cornelius et al.
6,525,275 B1 2/2003 Asai
7,112,880 B2 9/2006 Cornelius et al.
7,223,681 B2 5/2007 Hussa (Continued)

FOREIGN PATENT DOCUMENTS

CN 112701099 A * 4/2021 ............ H10W 72/20

*Primary Examiner* — Shahed Ahmed

(74) *Attorney, Agent, or Firm* — MORGAN, LEWIS & BOCKIUS LLP

(57) ABSTRACT

A semiconductor package includes a first substrate. Solder balls are disposed on a lower surface of the first substrate. A first semiconductor chip is on an upper surface of the first substrate. The solder balls include a first ball disposed in a first direction from a center of the first substrate and spaced apart from the center by a first distance. A second ball is disposed in a third direction from the center between the first and second directions and is spaced apart from the center by a second distance less than or equal to the first distance. A first pitch between the first ball and a first adjacent ball disposed immediately to an outer side in the first direction is less than a second pitch between the first ball and a second adjacent ball disposed immediately adjacent to an inner side in the first direction.

20 Claims, 12 Drawing Sheets

(56) References Cited

U.S. PATENT DOCUMENTS

| | | | | |
|---|---|---|---|---|
| 9,048,168 | B2 | 6/2015 | Kwon et al. | |
| 10,276,535 | B2 | 4/2019 | Call et al. | |
| 2009/0160475 | A1 | 6/2009 | Ali et al. | |
| 2013/0256883 | A1 | 10/2013 | Meyer et al. | |
| 2019/0115292 | A1* | 4/2019 | Morrison | H10W 72/00 |
| 2021/0242157 | A1* | 8/2021 | Scuderi | H10W 44/20 |
| 2022/0165680 | A1* | 5/2022 | Kim | H10W 42/20 |

* cited by examiner

SEMICONDUCTOR PACKAGE

CROSS-REFERENCE TO RELATED APPLICATION

This application claims priority under 35 U.S.C. § 119 to Korean Patent Application No. 10-2023-0000785, filed on Jan. 3, 2023 in the Korean Intellectual Property Office, the disclosure of which is incorporated by reference in its entirety herein.

1. TECHNICAL FIELD

The present disclosure relates to a semiconductor package.

2. DISCUSSION OF RELATED ART

The demand for high-capacity data processing for semiconductor devices has increased along as technology has advanced. Accordingly, semiconductor package technologies, such as ball grid array ("BGA"), flip chip ball grid array ("FCBGA"), wafer level package ("WLP"), and through silicon via ("TSV") are being developed to provide high integration, thin film, and light weight. These technologies may increase the number of I/O pins per unit area due to a decrease in bump size and pitch.

However, as the semiconductor devices are highly integrated and miniaturized, warpage of the semiconductor package occurs. The risk of short and non-wet defects increases due to the warpage of the semiconductor package. Therefore, a technology for preventing the warpage of the semiconductor package while increasing the number of I/O pins is desired for the semiconductor package.

SUMMARY

Aspects of embodiments of the present disclosure provide a semiconductor package having an increased number of I/O pins.

However, aspects of embodiments of the present disclosure are not restricted to those set forth herein. The above and other aspects of embodiments of the present disclosure will become more apparent to one of ordinary skill in the art to which the present disclosure pertains by referencing the detailed description of embodiments of the present disclosure given below.

According to an embodiment of the present disclosure, a semiconductor package includes a first substrate including a first surface extending in a first direction and a second surface extending in a second direction. Solder balls are disposed on a lower surface of the first substrate. A first semiconductor chip is on an upper surface of the first substrate. The solder balls include a first ball disposed in the first direction from a center of the first substrate. The first ball is spaced apart from the center of the first substrate by a first distance. A second ball is disposed in a third direction from the center of the first substrate. The third direction is between the first and second directions. The second ball is spaced apart from the center of the first substrate by a second distance. A first pitch between the first ball and a first adjacent ball disposed immediately adjacent to an outer side of the first ball in the first direction is less than a second pitch between the first ball and a second adjacent ball disposed immediately adjacent to an inner side of the first ball in the first direction. The second ball is spaced apart from a third adjacent ball disposed immediately adjacent to the outer side of the second ball in the first direction by the first pitch. The first distance is greater than or equal to the second distance.

According to an embodiment of the present disclosure, a semiconductor package includes a first substrate including a first surface extending in a first direction and a second surface extending in a second direction. Solder balls are disposed on a lower surface of the first substrate A first semiconductor chip is on an upper surface of the first substrate. The solder balls include a first ball group passing through a center of the first substrate. The first ball group includes first sub-balls aligned at a first pitch in the first direction. A second ball group passes through a center of the first substrate. The second ball group includes second sub-balls aligned at a second pitch in the third direction. The second pitch is less than the first pitch. An angle formed by the third direction and the first direction is about 45°. A distance from the center of the first substrate to an outermost first sub-ball is greater than a distance from the center of the first substrate to an outermost second sub-ball. A distance between the outermost second sub-ball and a first adjacent ball immediately adjacent to an inner side of the outermost second sub-ball in the first direction is the first pitch.

According to an embodiment of the present disclosure, a semiconductor package includes a first substrate including a first surface extending in a first direction and a second surface extending in a second direction. Solder balls are disposed on a lower surface of the first substrate. A first semiconductor chip is on an upper surface of the first substrate. An interposer is disposed on the first semiconductor chip. A first connection member connects the interposer and the first substrate to each other. A second substrate is disposed on the first substrate. A second semiconductor chip is on an upper surface of the second substrate. The solder balls include a first ball disposed in the first direction from a center of the first substrate. The first ball is spaced apart from the center of the first substrate by a first distance. A second ball is disposed in a third direction from the center of the first substrate. The third direction is between the first and second directions. The second ball is spaced apart from the center of the first substrate by a second distance. A first pitch between the first ball and a first adjacent ball disposed immediately adjacent to an outer side of the first ball in the first direction is less than a second pitch between the first ball and a second adjacent ball disposed immediately adjacent to an inner side of the first ball in the first direction. The second ball is spaced apart from a third adjacent ball disposed immediately adjacent to the outer side of the second ball in the first direction by the first pitch. The first distance greater than or equal to the second distance.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF EMBODIMENTS

Hereinafter, a semiconductor package according to example embodiments will be described with reference to FIGS. 1 to 5.

Figure 1:
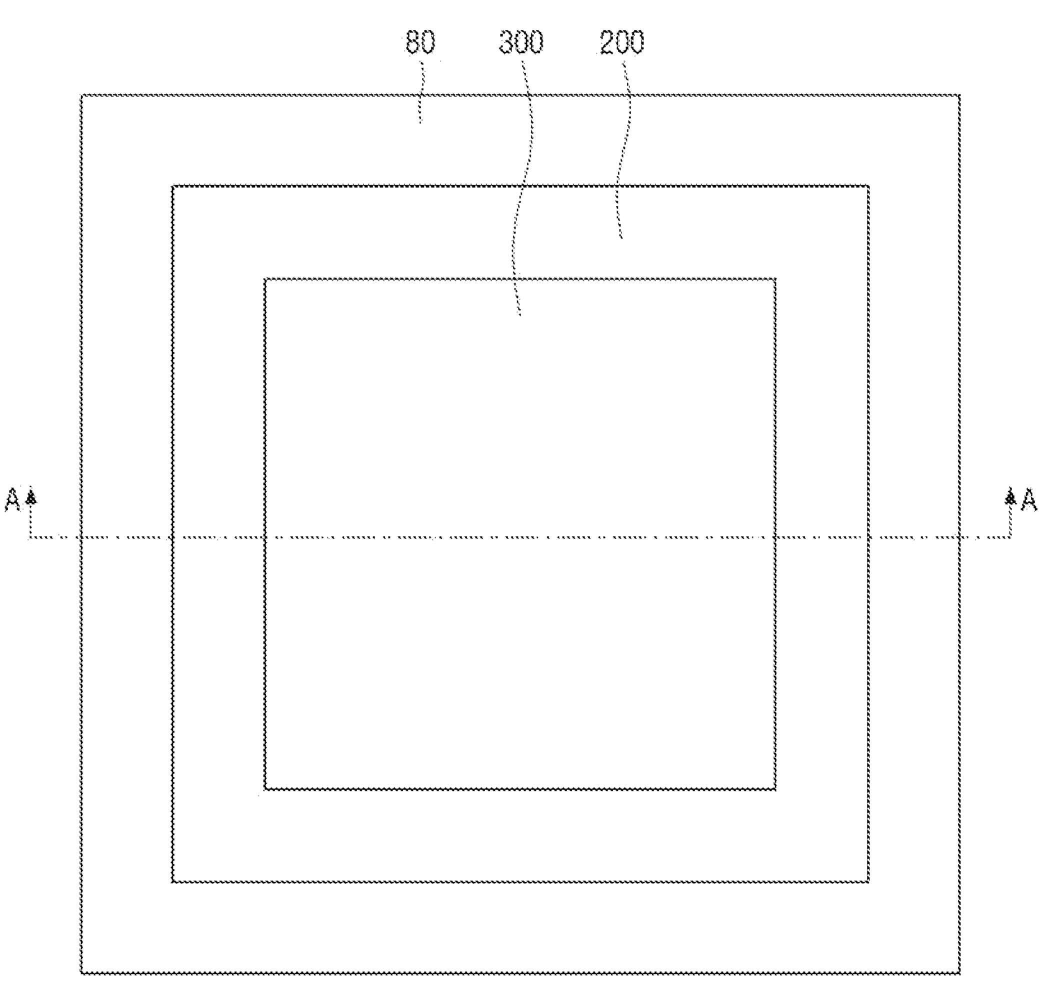
FIG. 1 is a plan view for describing a semiconductor package according to an embodiment of the present disclosure.
Figure 2:
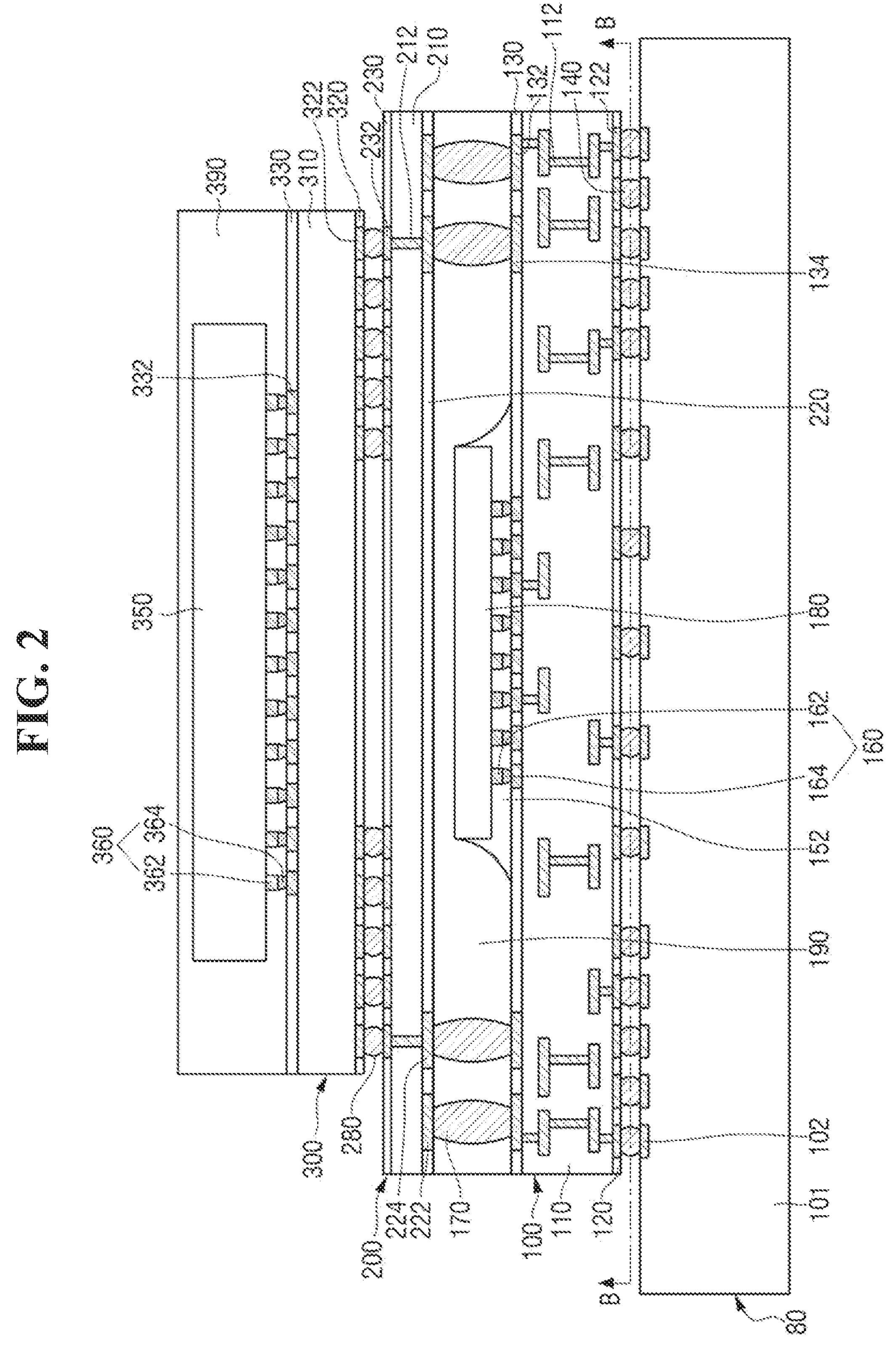
FIG. 2 is a cross-sectional view taken along line A-A of FIG. 1 according to an embodiment of the present disclosure.
Figure 3:
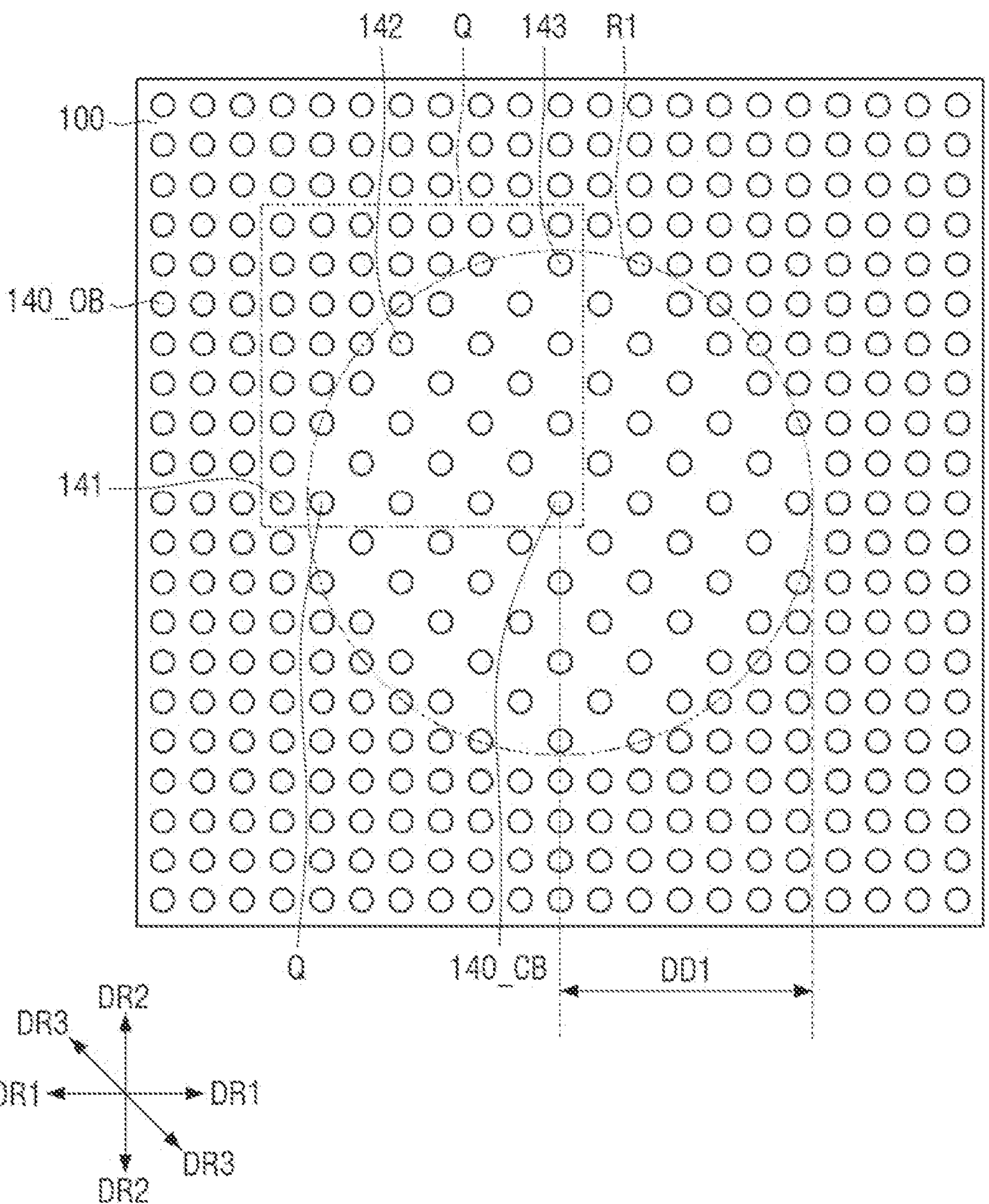
FIG. 3 is a view taken along line B-B of FIG. 2 according to an embodiment of the present disclosure.
Figure 4:
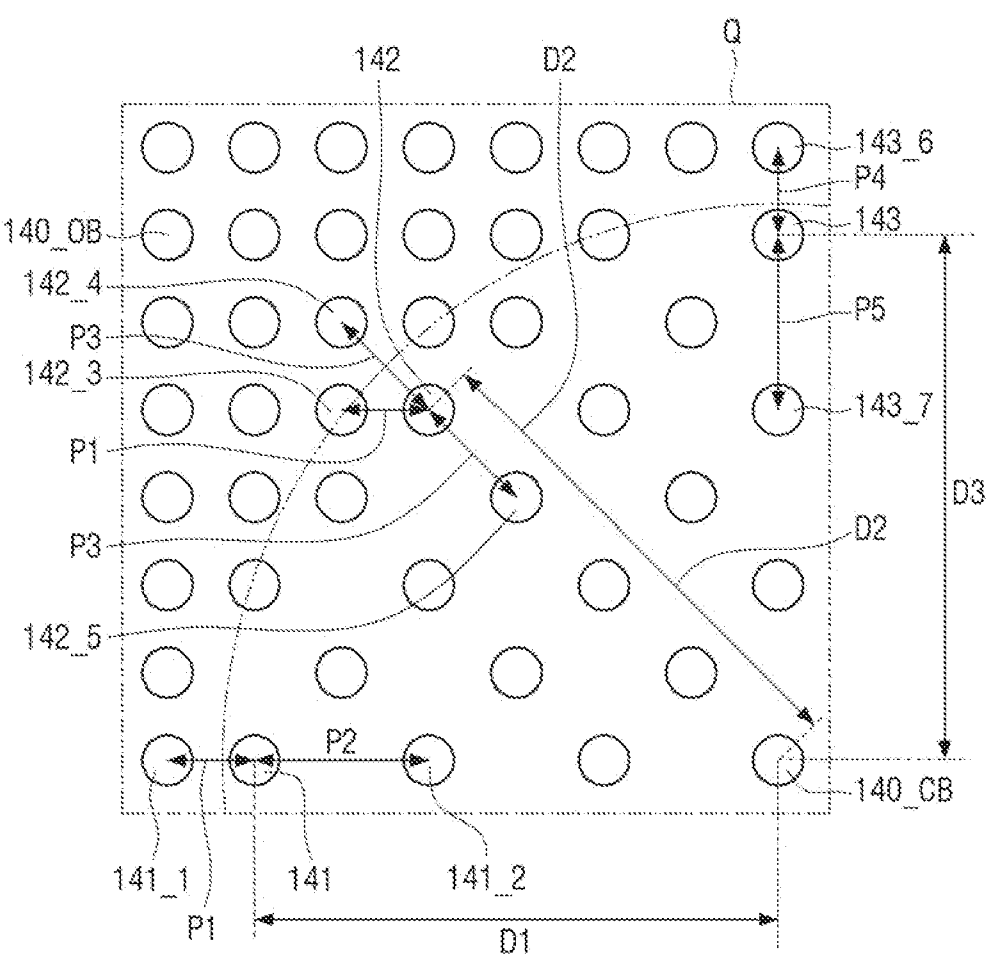
FIG. 4 is an enlarged view of an area P of FIG. 3 according to an embodiment of the present disclosure.
Figure 5:
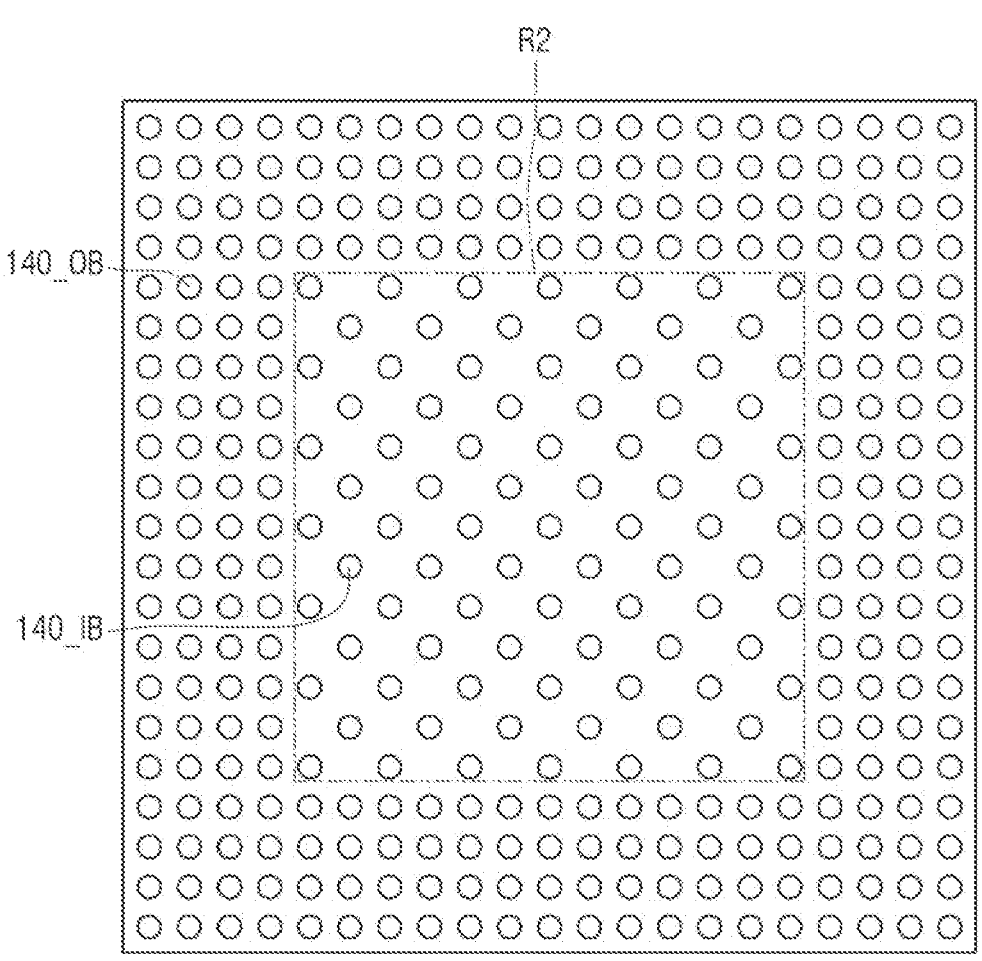
FIG. 5 is a view taken along line B-B of FIG. 2 according to an embodiment of the present disclosure.
Figure 5:
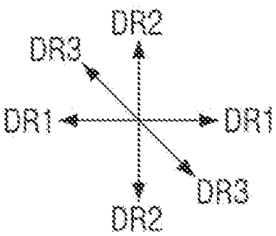

FIG. 1 is an example plan view for describing a semiconductor package according to some example embodiments. FIG. 2 is an example cross-sectional view taken along line A-A of FIG. 1. FIG. 3 is an example view taken along line B-B of FIG. 2. FIG. 4 is an enlarged view for describing an area P FIG. 3. FIG. 5 is an example view taken along line B-B of FIG. 2.

Referring to FIGS. 1 and 2, in an embodiment a semiconductor package may include a circuit board 80, a first substrate 100, solder balls 140, a first semiconductor chip 180, an interposer 200, and a second semiconductor chip 350.

In an embodiment, the circuit board 80 may be a board for a package. For example, the circuit board 80 may be a printed circuit board (PCB). The circuit board 80 may include a lower surface and an upper surface that are opposite to each other. The upper surface of the circuit board 80 may face the first substrate 100.

The circuit board 80 may include an insulating core 101 and a circuit board pad 102. The circuit board pad 102 may be disposed on (e.g., disposed directly thereon) the upper surface of the circuit board 80. In an embodiment, the circuit board 80 may further include a wiring pattern, a lower pad, and a connection member.

The circuit board 80 may be mounted on a main board of an electronic device. For example, in an embodiment, the circuit board 80 may be mounted on the main board of the electronic device through a connection member. In an embodiment, the circuit board 80 may be a ball grid array (BGA) board. However, embodiments of the present disclosure are not necessarily limited thereto.

In an embodiment, the first substrate 100 may include a first insulating layer 110, a first conductive pattern 112, a first lower passivation film 120, a first lower pad 122, a first upper passivation film 130, and a first upper pad 132.

The first insulating layer 110 and the first conductive pattern 112 in the first insulating layer 110 may constitute a wiring pattern for electrically connecting the first lower pad 122 and the first upper pad 132 to each other. The first insulating layer 110 is illustrated as being a single layer in FIG. 2 for convenience of explanation. However, embodiments of the present disclosure are not necessarily limited thereto. For example, in some embodiments the first insulating layer 110 may be constituted as multiple layers and the wiring pattern may include a multilayer first conductive pattern 112.

The first lower passivation film 120 and the first lower pad 122 may be formed on a lower surface of the first insulating layer 110 (e.g., disposed directly thereon). The first lower pad 122 may be electrically connected to the first conductive pattern 112. The first lower passivation film 120 may cover the lower surface of the first insulating layer 110 and expose portions of the first lower pad 122.

The first upper passivation film 130, the first upper pad 132, and the second upper pad 134 may be formed on an upper surface of the first insulating layer 110. The first upper passivation film 130 may cover the upper surface of the first insulating layer 110 and expose portions of the first upper pad 132 and the second upper pad 134.

In an embodiment, the first lower passivation film 120 and the first upper passivation film 130 may include, for example, a photoimageable dielectric (PID) material. However, embodiments of the present disclosure are not necessarily limited thereto.

In an embodiment, a passive element may be disposed on a lower surface of the first substrate 100. The passive element may be, for example, a capacitor. However, embodiments of the present disclosure are not necessarily limited thereto.

In an embodiment, the solder balls 140 may be formed on the lower surface of the first substrate 100 (e.g., disposed directly thereon). The solder balls 140 may be attached to the first lower pad 122. In an embodiment, the solder ball 140 may have, for example, a spherical or elliptical shape. However, embodiments of the present disclosure are not necessarily limited thereto. In an embodiment, the solder ball 140 may include, for example, tin (Sn), indium (In), bismuth (Bi), antimony (Sb), copper (Cu), silver (Ag), zinc (Zn), lead (Pb), and a combination thereof. However, embodiments of the present disclosure are not necessarily limited thereto and a material(s) of the solder ball 140 may vary.

The solder balls 140 may electrically connect the first substrate 100 and the circuit board 80 to each other. Accordingly, the solder balls 140 may provide electrical signals to the first substrate 100 or provide electrical signals provided from the first substrate 100 to the circuit board 80.

Hereinafter, an arrangement of the solder balls 140 will be described in detail.

Referring to FIGS. 3 and 4, the solder balls 140 may be disposed on (e.g., disposed directly thereon) the lower surface of the first substrate 100. The solder balls 140 may be aligned in a first direction DR1, a second direction DR2, and a third direction DR3. In an embodiment, the first direction DR1 is a direction of a first surface of the first substrate 100, and the second direction DR2 is a direction of a second surface of the first substrate 100. In an embodiment, the first direction DR1 and the second direction DR2 may be perpendicular to each other. The third direction DR3 may be a direction different from the first and second directions DR1 and DR2. For example, the third direction DR3 may be between the first and second directions DR1, DR2. In an embodiment, an angle between the third direction DR3 and the first direction DR1 may be about 45°. An angle between the third direction DR3 and the second direction DR2 may be about 45°. However, embodiments of the present disclosure are not necessarily limited thereto and the first to third directions DR1, DR2, DR3 may cross each other at various different angles. In an embodiment, the first to third directions DR1, DR2, DR3 may each be parallel to an upper surface of the first substrate 100.

The solder balls 140 may include first balls 141, second balls 142, third balls 143, a central ball 140_CB, and outer balls 140_OB.

The central ball 140_CB may be disposed at a center of the first substrate 100 in a plan view. For example, in an embodiment, the distances from the central ball 140_CB to both ends of the first substrate 100 in the first direction DR1 may be equal to each other. In an embodiment, distances from the central ball 140_CB to both ends of the first substrate 100 in the second direction DR2 may be equal to each other. Hereinafter, the center of the first substrate 100 may be a center of the central ball 140_CB. In addition, a spaced distance and pitch between the solder balls may be a distance measured from the center of one of the solder balls to the center of another of the solder balls.

The first ball 141 may be disposed in the first direction DR1 from the center of the first substrate 100. The first ball 141 may be spaced apart from the center of the first substrate 100 by a first distance D1 (FIG. 4). For example, the first distance D1 may be a distance from the center of the central ball 140_CB to a center of the first ball 141.

As shown in an embodiment of FIG. 4, the first ball 141 may be spaced apart from a first adjacent ball 141_1 disposed immediately adjacent to an outer side of the first ball 141 in the first direction DR1 by a first pitch P1. The first ball 141 may be spaced apart from a second adjacent ball 141_2 disposed immediately adjacent to an inner side of the first ball 141 in the first direction DR1 by a second pitch P2. In an embodiment, the first pitch P1 is less than the second pitch P2. The outer side is a direction away from the center of the first substrate 100, and the inner side is a direction closer to the center of the first substrate 100.

The second ball 142 may be disposed in the third direction DR3 from the center of the first substrate 100. As shown in an embodiment of FIG. 4, the second ball 142 may be spaced apart from the center of the first substrate 100 by a second distance D2. For example, the second distance D2 may be a distance from the center of the central ball 140_CB to a center of the second ball 142.

The second ball 142 may be spaced apart from a third adjacent ball 142_3 disposed immediately adjacent to an outer side of the second ball 142 in the first direction DR1 by the first pitch P1. The second ball 142 may be spaced apart from a fourth adjacent ball 142_4 disposed immediately adjacent to an outer side of the second ball 142 in the third direction DR3 by a third pitch P3. The second ball 142 may be spaced apart from a fifth adjacent ball 142_5 disposed immediately adjacent to an inner side of the second ball 142 in the third direction DR3 by a third pitch P3. For example, in an embodiment a distance between the second ball 142 and the fourth adjacent ball 142_4 immediately adjacent to the outer side of the second ball 142 in the third direction DR3 and a distance between the second ball 142 and the fifth adjacent ball 142_5 immediately adjacent to the inner side of the second ball 142 in the third direction DR3 may be equal to each other. The third pitch P3 may be greater than the first pitch P1. The third pitch P3 may be less than the second pitch P2.

The third ball 143 may be disposed in the second direction DR2 from the center of the first substrate 100. As shown in an embodiment of FIG. 4, the third ball 143 may be spaced apart from the center of the first substrate 100 by a third distance D3. For example, the third distance D3 may be a distance from the center of the central ball 140_CB to a center of the third ball 143.

The third ball 143 may be spaced apart from a sixth adjacent ball 143_6 disposed immediately adjacent to an outer side of the third ball 143 in the second direction DR2 at a fourth pitch P4. The third ball 143 may be spaced apart from a seventh adjacent ball 143_7 disposed immediately adjacent to an inner side of the third ball 143 in the second direction DR2 at a fifth pitch P5. In an embodiment, the fourth pitch P4 is less than the fifth pitch P5. In some embodiments, the fourth pitch P4 may be equal to the first pitch P1, and the fifth pitch P5 may be equal to the second pitch P2. However, embodiments of the present disclosure are not necessarily limited thereto.

In an embodiment, the first distance D1 may be greater than or equal to the second distance D2. The third distance D3 may be greater than or equal to the second distance D2. In some embodiments, the first distance D1 and the third distance D3 may be equal to each other.

To describe the arrangement of the solder balls 140, a first area R1 having a virtual line may be provided as shown in FIGS. 3-4. In an embodiment, the first area R1 may have a circular shape having a first radius DD1 from the center of the first substrate 100. For example, the first area R1 may be a virtual circle. The first area R1 may include the first ball 141, the second ball 142, and the third ball 143. For example, the first ball 141, the second ball 142, and the third ball 143 may be disposed within the first area R1. The first adjacent ball 141_1, the fourth adjacent ball 142_4, and the sixth adjacent ball 143_6 may be disposed outside the first area R1. The second adjacent ball 141_2, the fifth adjacent ball 142_5, and the seventh adjacent ball 143_7 may be disposed within the first area R1. In an embodiment, the third adjacent ball 142_3 may be disposed on (e.g., directly thereon) the virtual line of the first area R1.

It is illustrated in an embodiment shown in FIG. 3 that the radius DD1 of the first area R1 is ¼ or more of a width of the first substrate 100 in the first direction DR1. However, embodiments of the present disclosure are not necessarily limited thereto. The radius DD1 of the first area R1 may vary according to a design of the semiconductor package. For example, the radius DD1 of the first area R1 may also be smaller or greater than that illustrated in an embodiment shown in FIG. 3.

The outer balls 140_OB may be disposed around the first area R1 (e.g., outside the first area R1). In an embodiment, the outer balls 140_OB may be aligned in the first direction DR1. The outer balls 140_OB may be arranged to be spaced apart from each other by the first pitch P1 in the first direction DR1. The outer balls 140_OB may also be aligned in the second direction DR2. The outer balls 140_OB may be arranged to be spaced apart from each other by the first pitch P1 in the second direction DR2. The outer balls 140_OB may be aligned in the third direction DR3. The outer balls 140_OB may be arranged to be spaced apart from each other by the third pitch P3 in the third direction DR3.

Referring to FIG. 5, to describe the arrangement of the solder balls 140, a second area R2 may be provided. The solder balls 140 may include inner balls 140_IB and outer balls 140_OB. The inner balls 140_IB may be disposed within the second area R2. The outer balls 140_OB may be disposed outside the second area R2 and may surround the second area R2. In an embodiment, the inner balls 140_IB may be arranged at a second pitch P2 in the first and second directions DR1 and DR2. The outer balls 140_OB may be arranged at a first pitch P1 in the first and second directions DR1 and DR2.

In an embodiment, the second area R2 may have a quadrangular shape formed by a virtual line. In an embodiment, a width of the second area R2 in the first direction DR1 may be the same as a diameter of the first area R1 in the first direction DR1 of an embodiment shown in FIG. 3.

Referring to FIGS. 3 and 5, a size (e.g., an area in the first and second directions D1, D2) of the first area R1 is less than that of the second area R2. The number of outer balls 140_OB in an embodiment of FIG. 3 is greater than the number of outer balls 140_OB in an embodiment FIG. 5. For example, the number of solder balls 140 in FIG. 3 is greater than the number of solder balls 140 in FIG. 5. Electrical characteristics of the semiconductor package may be increased when the number of I/O pins increases. Therefore, the semiconductor package of an embodiment of FIG. 3 may have increased electrical characteristics as compared to those of the semiconductor package of an embodiment of FIG. 5.

Referring back to FIG. 2, the first semiconductor chip 180 may be disposed on the first substrate 100. For example, in an embodiment the first semiconductor chip 180 may be mounted on an upper surface of the first substrate 100. In an embodiment, the first semiconductor chip 180 may be an integrated circuit (IC) in which hundreds to millions of semiconductor elements are integrated into a single chip. For example, in some embodiments the first semiconductor chip 180 may be an application processor (AP) such as a central processing unit (CPU), a graphic processing unit (GPU), a field-programmable gate array (FPGA), a digital signal processor, a cryptographic processor, a microprocessor, or a microcontroller. However, embodiments of the present disclosure are not necessarily limited thereto. For example, in some embodiments the first semiconductor chip 180 may be a logic chip such as an analog-digital converter (ADC) or an application-specific IC (ASIC), and may also be a memory chip such as a volatile memory (e.g., DRAM) or a non-volatile memory (e.g., ROM or flash memory). In addition, the first semiconductor chip 180 may also be configured by combining the above-mentioned elements.

Although an embodiment shown in FIG. 2 includes only one first semiconductor chip 180 formed on the first substrate 100, this is only for convenience of explanation. For example, in some embodiments a plurality of first semiconductor chips 180 may also be formed side by side on the first substrate 100, or may also be sequentially stacked on the first substrate 100.

In an embodiment, the first semiconductor chip 180 may be mounted on the first substrate 100 by a flip chip bonding method. For example, first bumps 160 may be formed between the upper surface of the first substrate 100 and a lower surface of the first semiconductor chip 180. The first bumps 160 may electrically connect the first substrate 100 and the first semiconductor chip 180 to each other.

In an embodiment, the first bump 160 may include, for example, a first pillar layer 162 and a first solder layer 164.

The first pillar layer 162 may protrude from the lower surface of the first semiconductor chip 180. In an embodiment, the first pillar layer 162 may include, for example, copper (Cu), a copper alloy, nickel (Ni), a nickel alloy, palladium (Pd), platinum (Pt), gold (Au), cobalt (Co), and a combination thereof. However, embodiments of the present disclosure are not necessarily limited thereto.

The first solder layer 164 may connect the first pillar layer 162 and the first substrate 100 to each other. For example, the first solder layer 164 may be connected to some of the first upper pads 132. In an embodiment, the first solder layer 164 may have, for example, a spherical or elliptical shape. However, embodiments of the present disclosure are not necessarily limited thereto. In an embodiment, the first solder layer 164 may include, for example, tin (Sn), indium (In), bismuth (Bi), antimony (Sb), copper (Cu), silver (Ag), zinc (Zn), lead (Pb), and a combination thereof. However, embodiments of the present disclosure are not necessarily limited thereto.

The interposer 200 may be interposed between the first substrate 100 and a second substrate 300. For example, the interposer 200 may be disposed on the upper surface of the first substrate 100. In an embodiment, the interposer 200 may be disposed on the upper surface of the first semiconductor chip 180. The interposer 200 may facilitate a connection between the first substrate 100 and the second substrate 300. In addition, the interposer 200 may prevent warpage of the first substrate 100 and the second substrate 300.

The interposer 200 may include a lower surface and an upper surface that are opposite to each other. For example, the lower surface of the interposer 200 may face the upper surface of the first substrate 100, and the upper surface of the interposer 200 may face a lower surface of the second substrate 300.

In an embodiment, the interposer 200 may include a second insulating layer 210, a second conductive pattern 212, a second lower passivation film 220, a second lower pad 222, a second upper passivation film 230, and a third upper pad 232.

The second insulating layer 210 and the second conductive pattern 212 in the second insulating layer 210 may constitute a wiring pattern for electrically connecting the second lower pad 222 and the third upper pad 232 to each other. In an embodiment shown in FIG. 2, the second insulating layer 210 is illustrated as being a single layer for convenience of explanation. However, embodiments of the present disclosure are not necessarily limited thereto. For example, in an embodiment the second insulating layer 210 may be constituted as multiple layers and the wiring pattern may include a multilayer second conductive pattern 212.

The second lower passivation film 220, the second lower pad 222, and the third lower pad 224 may be formed on a lower surface of the second insulating layer 210. The second lower passivation film 220 may cover the lower surface of the second insulating layer 210 and expose portions of the second lower pad 222 and the third lower pad 224.

The second upper passivation film 230 and the third upper pad 232 may be formed on an upper surface of the second insulating layer 210. The third upper pad 232 may be electrically connected to the second conductive pattern 212. The second upper passivation film 230 may cover the upper surface of the second insulating layer 210 and expose portions of the third upper pad 232.

In an embodiment, the second lower passivation film 220 and the second upper passivation film 230 may include, for example, a photoimageable dielectric (PID) material. However, embodiments of the present disclosure are not necessarily limited thereto.

A first connection member 170 may be interposed between the first substrate 100 and the interposer 200. In an embodiment, the first connection member 170 may be in direct contact with the upper surface of the first substrate 100 and the lower surface of the interposer 200. The first connection member 170 may electrically connect the first substrate 100 and the interposer 200 to each other. For example, in an embodiment the first connection member 170 may be in direct contact with the first upper pad 132 of the first substrate 100 and the second lower pad 222 of the interposer 200. Accordingly, the first connection member 170 may electrically connect the first conductive pattern 112 and the second conductive pattern 212 to each other.

In an embodiment, the first connection member 170 may have, for example, a spherical or elliptical shape. However, embodiments of the present disclosure are not necessarily limited thereto. In an embodiment, the first connection member 170 may include, for example, tin (Sn), indium (In), bismuth (Bi), antimony (Sb), copper (Cu), silver (Ag), zinc (Zn), lead (Pb), and a combination thereof. However, embodiments of the present disclosure are not necessarily limited thereto.

In an embodiment, a first molding film 190 may be formed on the first substrate 100. The first molding film 190 may fill an area between the first substrate 100 and the interposer 200. Accordingly, the first molding film 190 may cover and protect the first substrate 100, the first semiconductor chip 180, the first bump 160, and the first connection member 170. The first connection member 170 may penetrate through the first molding film 190 to electrically connect the first substrate 100 and the interposer 200 to each other.

In an embodiment, the first molding film 190 may include, for example, an insulating polymer material such as an epoxy molding compound (EMC). However, embodiments of the present disclosure are not necessarily limited thereto.

In an embodiment, an underfill 152 may be formed on the first substrate 100. The underfill 152 may fill an area between the first substrate 100 and the first semiconductor chip 180. For example, in an embodiment the underfill may directly contact a bottom surface and portions of lateral side surfaces of the first semiconductor chip 180. The underfill 152 may prevent the first semiconductor chip 180 from being cracked by fixing the first semiconductor chip 180 on the first substrate 100. The underfill 152 may cover the first bump 160. The first bump 160 may penetrate through the underfill 152 to electrically connect the first substrate 100 and the first semiconductor chip 180 to each other.

In an embodiment, the underfill 152 may include, for example, an insulating polymer material such as an EMC. However, embodiments of the present disclosure are not necessarily limited thereto. In some embodiments, the underfill 152 may include a material different from that of the first molding film 190. For example, the underfill 152 may include an insulating material having greater fluidity than the first molding film 190. Accordingly, the underfill 152 may efficiently fill a narrow space between the first substrate 100 and the first semiconductor chip 180.

The second substrate 300 may be disposed on the upper surface of the interposer 200. In an embodiment, the second substrate 300 may be a substrate for a package. For example, the second substrate 300 may be a printed circuit board (PCB) or a ceramic substrate. Alternatively, the second substrate 300 may also be a substrate for a wafer level package (WLP) manufactured at a wafer level. The second substrate 300 may include a lower surface and an upper surface that are opposite to each other. For example, the lower surface of the second substrate 300 may face the upper surface of the interposer 200.

In an embodiment, the second substrate 300 may include a third insulating layer 310, a third lower passivation film 320, a fourth lower pad 322, a third upper passivation film 330, and a fourth upper pad 332.

In an embodiment, the third insulating layer 310 and a conductive pattern in the third insulating layer 310 may constitute a wiring pattern for electrically connecting the fourth lower pad 322 and the fourth upper pad 332 to each other. In an embodiment shown in FIG. 2, the third insulating layer 310 is illustrated as being a single layer for convenience of explanation. However, embodiments of the present disclosure are not necessarily limited thereto. For example, in an embodiment the third insulating layer 310 may be constituted as multiple layers and the wiring pattern may include a multilayer conductive pattern.

The third lower passivation film 320 and the fourth lower pad 322 may be formed on (e.g., disposed directly thereon) a lower surface of the third insulating layer 310. The third lower passivation film 320 may cover the lower surface of the third insulating layer 310 and expose portions of the fourth lower pad 322.

The third upper passivation film 330 and the fourth upper pad 332 may be formed on (e.g., disposed directly thereon) an upper surface of the third insulating layer 310. The third upper passivation film 330 may cover the upper surface of the third insulating layer 310 and expose portions of the fourth upper pad 332.

In an embodiment, the third lower passivation film 320 and the third upper passivation film 330 may include, for example, a photoimageable dielectric (PID) material. However, embodiments of the present disclosure are not necessarily limited thereto.

A second connection member 280 may be interposed between the interposer 200 and the second substrate 300. The second connection member 280 may be in direct contact with the upper surface of the interposer 200 and the lower surface of the second substrate 300. The second connection member 280 may electrically connect the interposer 200 and the second substrate 300 to each other. For example, the second connection member 280 may be in direct contact with the third upper pad 232 of the interposer 200 and the fourth lower pad 322 of the second substrate 300.

In an embodiment, the second connection member 280 may have, for example, a spherical or elliptical shape. However, embodiments of the present disclosure are not necessarily limited thereto. In an embodiment, the second connection member 280 may include, for example, tin (Sn), indium (In), bismuth (Bi), antimony (Sb), copper (Cu), silver (Ag), zinc (Zn), lead (Pb), and a combination thereof. However, embodiments of the present disclosure are not necessarily limited thereto.

The second semiconductor chip 350 may be disposed on the second substrate 300. For example, the second semiconductor chip 350 may be mounted on the upper surface of the second substrate 300. In an embodiment, the second semiconductor chip 350 may be an integrated circuit (IC) in which hundreds to millions of semiconductor elements are integrated into a single chip.

In an embodiment, the first semiconductor chip 180 may be a logic chip such as an application processor (AP), and the second semiconductor chip 350 may be a memory chip such as a volatile memory (e.g., DRAM) or a non-volatile memory (e.g., ROM or flash memory). However, embodiments of the present disclosure are not necessarily limited thereto.

Although it is illustrated in an embodiment of FIG. 2 that one second semiconductor chip 350 is formed on the second substrate 300, this is only for convenience of explanation. For example, in some embodiments a plurality of second semiconductor chips 350 may also be formed side by side on the second substrate 300, or may also be sequentially stacked on the second substrate 300.

In an embodiment, the second semiconductor chip 350 may be mounted on the second substrate 300 by a flip chip bonding method. For example, second bumps 360 may be formed between the upper surface of the second substrate 300 and a lower surface of the second semiconductor chip 350. In an embodiment, the second bumps 360 may directly contact the fourth upper pad 332. The second bumps 360 may electrically connect the second substrate 300 and the second semiconductor chip 350 to each other.

In an embodiment, the second bump 360 may include, for example, a second pillar layer 362 and a second solder layer 364. Since the second pillar layer 362 and the second solder layer 364 may be similar to the first pillar layer 162 and the first solder layer 164 described above, a detailed description thereof will be omitted for economy of description.

In an embodiment, a second molding film 390 may be formed on the second substrate 300. The second molding film 390 may cover and protect the second substrate 300, the second semiconductor chip 350, and the second bumps 360. In an embodiment, the second molding film 390 may include, for example, an insulating polymer material such as an EMC. However, embodiments of the present disclosure are not necessarily limited thereto.

Figure 6:
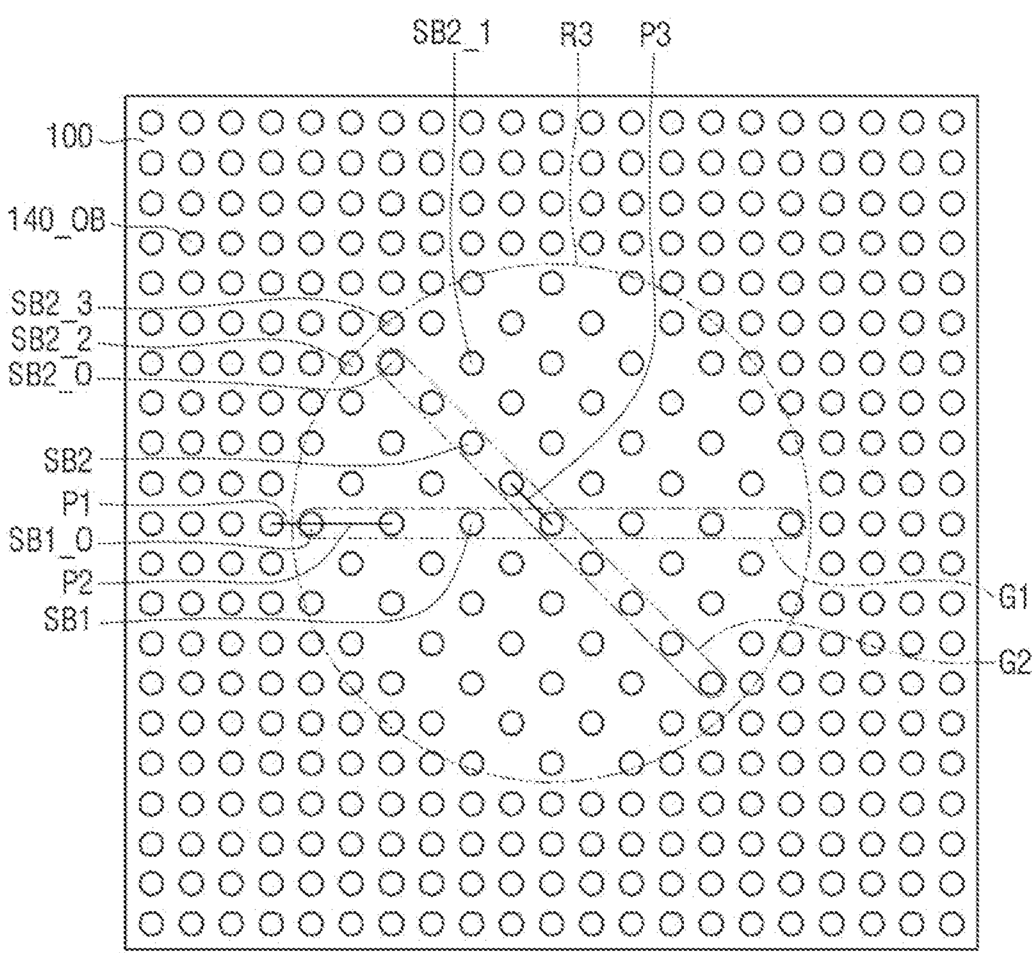
FIG. 6 is an illustrative view for describing a semiconductor package according to an embodiment of the present disclosure.
Figure 6:
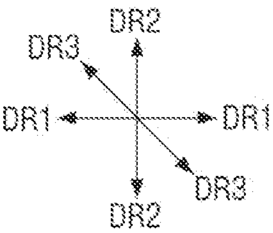

FIG. 6 is an illustrative view for describing a semiconductor package according to an embodiment. FIG. 6 is a view taken along line B-B of FIG. 2. For convenience of explanation, a description of elements that are similar or identical to those described above with reference to FIGS. 1 to 4 will be briefly described or omitted.

Referring to FIG. 6, the solder balls 140 may include a first ball group G1, a second ball group G2, and outer balls 140_OB.

The first ball group G1 may include first sub-balls SB1 aligned in the first direction DR1. The first sub-balls SB1 may be spaced apart from each other by a first pitch P1 in the first direction DR1. The first ball group G1 may pass through the center of the first substrate 100.

The first ball group G1 may include the outermost first sub-ball SB1_O. The outermost first sub-ball SB1_O may be a first sub-ball SB1 in the first ball group G1 spaced farthest from the center of the first substrate 100. A distance between the outermost first sub-ball SB1_O and the outer ball 140_OB disposed immediately adjacent to an outer side of the outermost first sub-ball SB1_O in the first direction DR1 may be a first pitch P1. A distance between the outermost first sub-ball SB1_O and the first sub-ball SB1 disposed immediately adjacent to an inner side of the outermost first sub-ball SB1_O in the first direction DR1 may be a second pitch P2. In an embodiment, the first pitch P1 is less than the second pitch P2. In an embodiment, the outermost first sub-ball SB1_O may correspond to the first ball 141 in an embodiment shown in FIG. 3.

The second ball group G2 may include second sub-balls SB2 aligned in the third direction DR3. The second sub-balls SB2 may be spaced apart from each other by a third pitch P3 in the third direction DR3. The second ball group G2 may pass through the center of the first substrate 100. In an embodiment, the third pitch P3 is greater than the first pitch P1 and less than the second pitch P2.

The second ball group G2 may include the outermost second sub-ball SB2_O. The outermost second sub-ball SB2_O may be a second sub-ball SB2 in the second ball group G2 spaced farthest from the center of the first substrate 100 (e.g., in the third direction D3). A distance between the outermost second sub-ball SB2_O and the outer ball 140_OB disposed immediately adjacent to an outer side of the outermost second sub-ball SB2_O in the third direction DR3 may be equal to a distance between the outermost second sub-ball SB2_O and the second sub-ball SB2 disposed immediately adjacent to an inner side of the outermost second sub-ball SB2_O in the third direction DR3.

The outermost second sub-ball SB2_O may be spaced apart from a first adjacent ball SB2_1 disposed immediately adjacent to an inner side of the outermost second sub-ball SB2_O in the first direction DR1 by the second pitch P2. The outermost second sub-ball SB2_O may be spaced apart from a second adjacent ball SB2_2 disposed immediately adjacent to an outer side of the outermost second sub-ball SB2_O in the first direction DR1 by the first pitch P1. The outermost second sub-ball SB2_O may be spaced apart from a third adjacent ball SB2_3 disposed immediately adjacent to an outer side of the outermost second sub-ball SB2_O in the second direction DR2 by a first pitch P1.

In an embodiment, the outermost second sub-ball SB2_O may correspond to the second ball 142 in an embodiment of FIG. 3.

A distance from the center of the first substrate 100 to the outermost first sub-ball SB1_O may be greater than or equal to a distance from the center of the first substrate 100 to the outermost second sub-ball SB2_O.

In an embodiment, the number of first sub-balls SB1 of the first ball group G1 may be less than the number of second sub-balls SB2 of the second ball group G2. However, embodiments of the present disclosure are not necessarily limited thereto and the number of first sub-balls SB1 and second sub-balls SB2 may vary depending on the design of the semiconductor package.

To describe the arrangement of the solder balls 140, a third area R3 having a virtual line may be provided. In an embodiment, the third area R3 may have a circular shape having a constant radius from the center of the first substrate 100. In an embodiment, the third area R3 may correspond to the first area R1 of FIG. 3.

The first ball group G1 and the second ball group G2 may be disposed in the third area R3. The outer balls 140_OB may be disposed outside the third area R3 and may surround the third area R3. A description of the outer ball 140_OB may be the same as described above.

Figure 7:
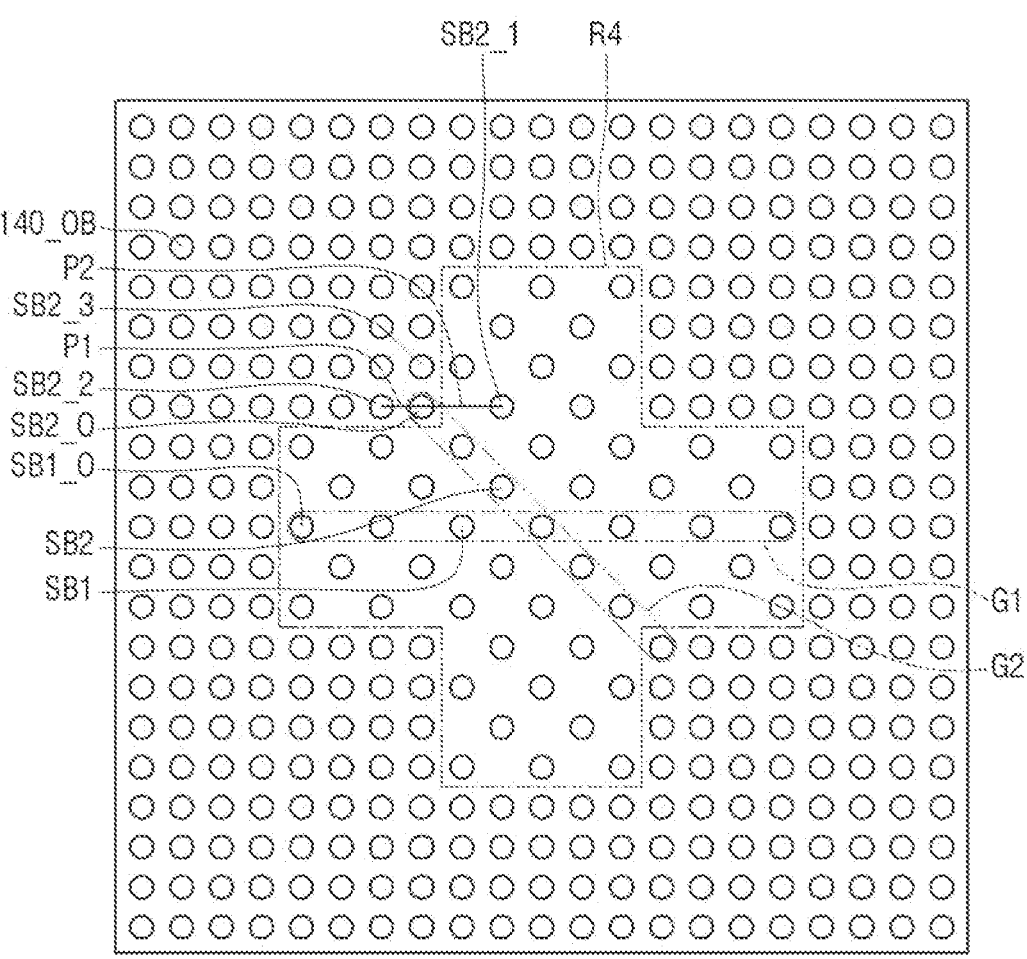
FIG. 7 is an illustrative view for describing a semiconductor package according to an embodiment of the present disclosure.
Figure 7:
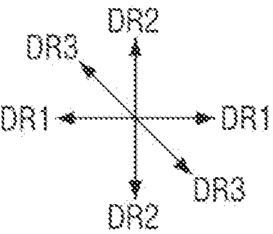

FIG. 7 is an illustrative view for describing a semiconductor package according to an embodiment. FIG. 7 is a view taken along line B-B of FIG. 2. For convenience of explanation, elements that are similar or identical to those described above with reference to embodiments of FIGS. 1 to 4 and 6 will be briefly described or omitted.

The second ball group G2 may include the outermost second sub-ball SB2_O. The outermost second sub-ball SB2_O may be a second sub-ball SB2 in the second ball group G2 spaced farthest from the center of the first substrate 100 (e.g., in the third direction D3). A distance between the outermost second sub-ball SB2_O and the outer ball 140_OB disposed immediately adjacent to an outer side of the outermost second sub-ball SB2_O in the third direction DR3 may be equal to a distance between the outermost second sub-ball SB2_O and the second sub-ball SB2 disposed immediately adjacent to an inner side of the outermost second sub-ball SB2_O in the third direction DR3.

The outermost second sub-ball SB2_O may be spaced apart from a first adjacent ball SB2_1 disposed immediately adjacent to an inner side of the outermost second sub-ball SB2_O in the first direction DR1 by a second pitch P2. The outermost second sub-ball SB2_O may be spaced apart from a second adjacent ball SB2_2 disposed immediately adjacent to an outer side of the outermost second sub-ball SB2_O in the first direction DR1 by a first pitch P1. The outermost second sub-ball SB2_O may be spaced apart from a third adjacent ball SB2_3 disposed immediately adjacent to an outer side of the outermost second sub-ball SB2_O in the second direction DR2 by a first pitch P1.

In an embodiment shown in FIG. 7, the number of first sub-balls SB1 of the first ball group G1 may be equal to the number of second sub-balls SB2 of the second ball group G2. However, embodiments of the present disclosure are not necessarily limited thereto. For example, in an embodiment the number of first sub-balls SB1 and second sub-balls SB2 may vary depending on the design of the semiconductor package.

To describe the arrangement of the solder balls 140, a fourth area R4 having a virtual line may be provided. The first ball group G1 may be disposed in the fourth area R4. A portion of the second ball group G2 may be disposed in the fourth area R4. For example, in an embodiment the second sub-balls SB2 other than the outermost second sub-ball SB2_O in the second ball group G2 may be disposed in the fourth area R4. The outermost second sub-ball SB2_O on both sides in the third direction D3 may be disposed outside the fourth area R4. The solder balls 140 disposed in the fourth area R4 may be spaced apart from each other by a second pitch P2 in the first and second directions DR1 and DR2. The fourth area R4 may have an intersection shape.

Figure 8:
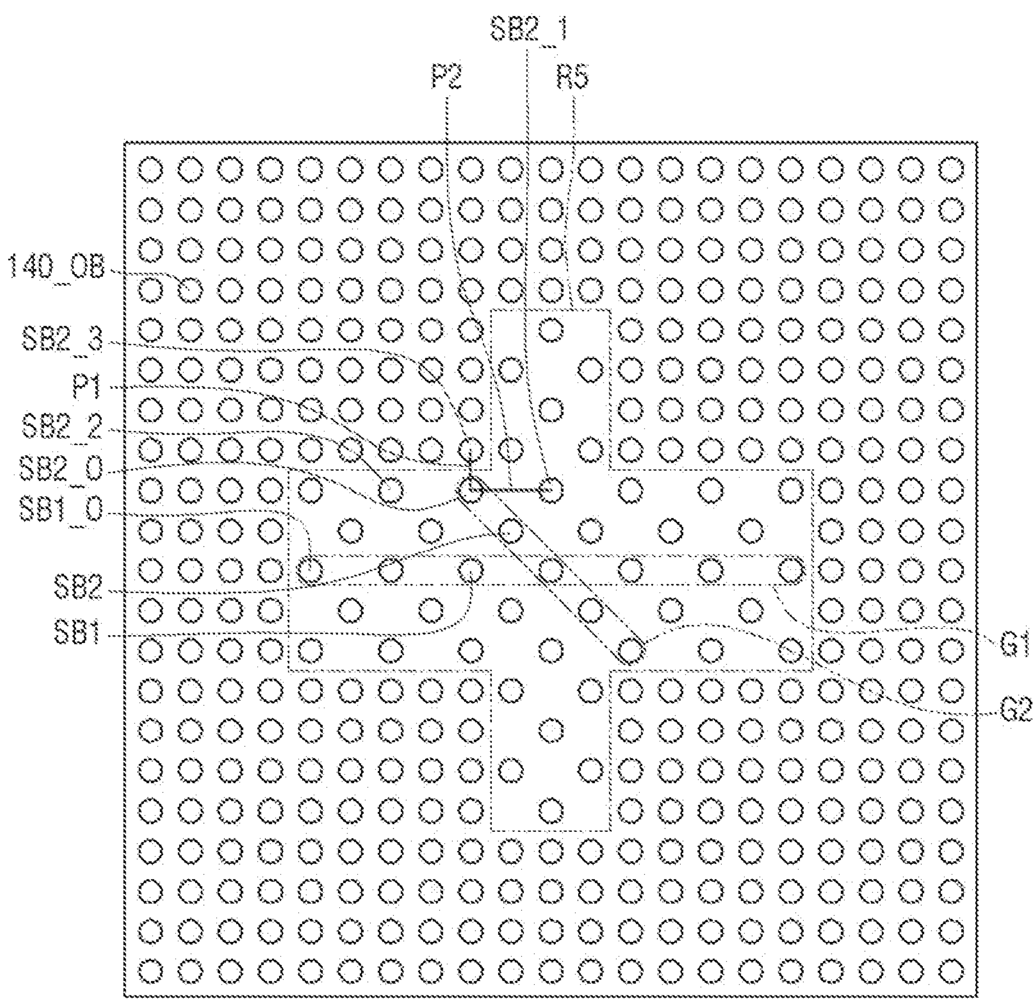
FIG. 8 is an illustrative view for describing a semiconductor package according to an embodiment of the present disclosure.
Figure 8:
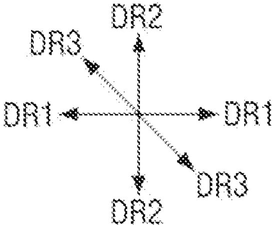

FIG. 8 is an illustrative view for describing a semiconductor package according to some example embodiments. FIG. 8 is a view taken along line B-B of FIG. 2. For convenience of explanation, a description of elements that are identical or similar to those described above with reference to embodiments of FIGS. 1 to 7 will be briefly described or omitted.

The second ball group G2 may include the outermost second sub-ball SB2_O. The outermost second sub-ball SB2_O may be a second sub-ball SB2 in the second ball group G2 spaced farthest from the center of the first substrate 100.

The outermost second sub-ball SB2_O may be spaced apart from a first adjacent ball SB2_1 disposed immediately adjacent to an inner side of the outermost second sub-ball SB2_O in the first direction DR1 by a second pitch P2. The outermost second sub-ball SB2_O may be spaced apart from a second adjacent ball SB2_2 disposed immediately adjacent to an outer side of the outermost second sub-ball SB2_O in the first direction DR1 by a second pitch P2. The outermost second sub-ball SB2_O may be spaced apart from a third adjacent ball SB2_3 disposed immediately adjacent to an outer side of the outermost second sub-ball SB2_O in the second direction DR2 by a first pitch P1.

For example, a distance between the outermost second sub-ball SB2_O and the first adjacent ball SB2_1 may be equal to a distance between the outermost second sub-ball SB2_O and the second adjacent ball SB2_2. The distance between the outermost second sub-ball SB2_O and the second adjacent ball SB2_2 may be different from a distance between the outermost second sub-ball SB2_O and the third adjacent ball SB2_3.

In an embodiment, the number of first sub-balls SB1 of the first ball group G1 may be greater than the number of second sub-balls SB2 of the second ball group G2. However, embodiments of the present disclosure are not necessarily limited thereto. For example, in an embodiment the number of first sub-balls SB1 and second sub-balls SB2 may vary depending on the design of the semiconductor package.

To describe the arrangement of the solder balls 140, a fifth area R5 having a virtual line may be provided. The first ball group G1 and the second ball group G2 may be disposed in the fifth area R5. The outer balls 140_OB may be disposed outside the fifth area R5 and may surround the fifth area R5. The solder balls 140 disposed in the fifth area R5 may be spaced apart from each other by a second pitch P2 in the first and second directions DR1 and DR2. The fifth area R5 may have an intersection shape in which a width thereof in the first direction DR1 is different from a width thereof in the second direction DR2.

Figure 9:
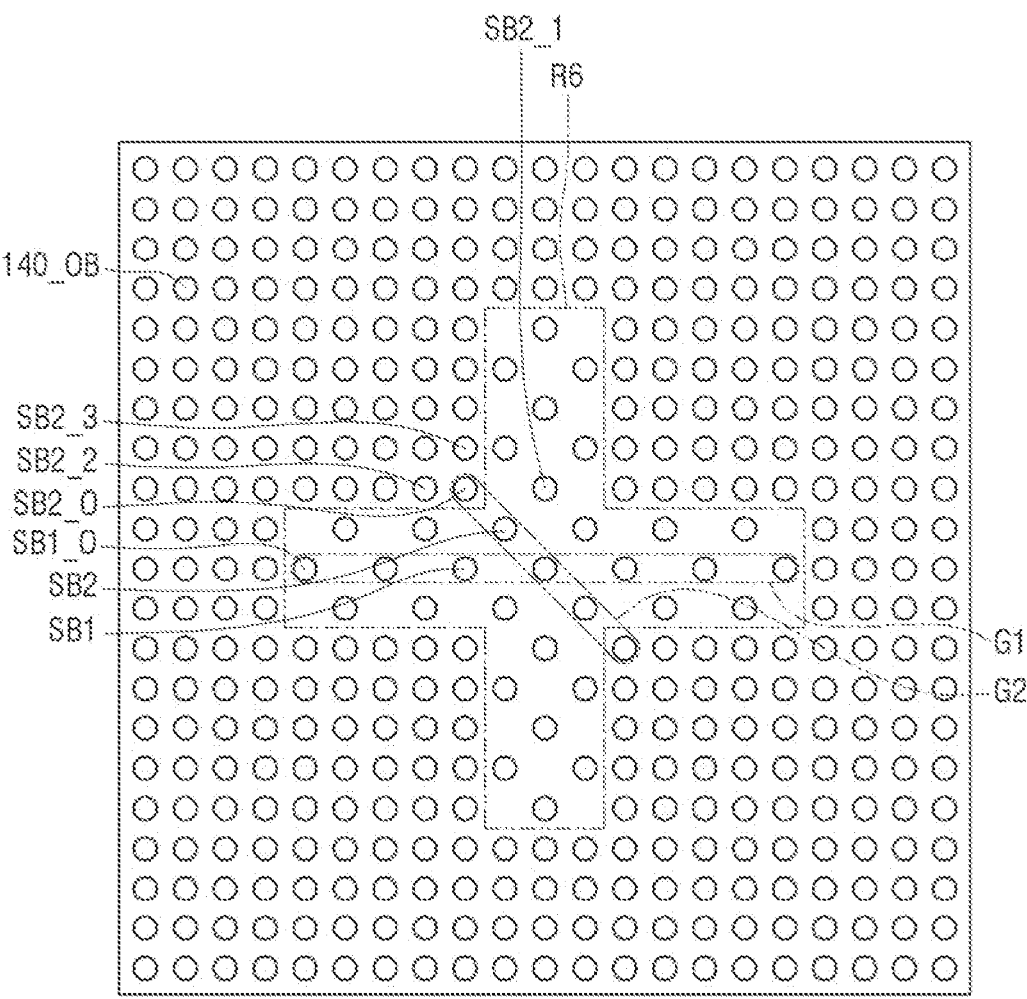
FIG. 9 is an illustrative view for describing a semiconductor package according to an embodiment of the present disclosure.
Figure 9:
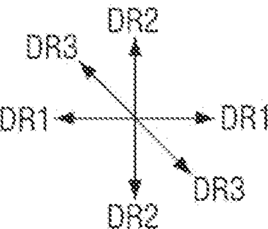

FIG. 9 is an illustrative view for describing a semiconductor package according to some example embodiments. FIG. 9 is a view taken along line B-B of FIG. 2. For convenience of explanation, a description of elements that are identical or similar to those described above with reference to an embodiment of FIG. 7 will be briefly described or omitted.

In an embodiment, the number of first sub-balls SB1 of the first ball group G1 may be greater than the number of second sub-balls SB2 of the second ball group G2. However, embodiments of the present disclosure are not necessarily limited thereto and the number of first sub-balls SB1 and second sub-balls SB2 may vary depending on the design of the semiconductor package.

To describe the arrangement of the solder balls 140, a sixth area R6 having a virtual line may be provided. The solder balls 140 disposed in the sixth area R6 may be spaced apart from each other by a second pitch P2 in the first and second directions DR1 and DR2. The sixth area R6 may have an intersection shape in which a width thereof in the first direction DR1 is equal to a width thereof in the second direction DR2.

Figure 10:
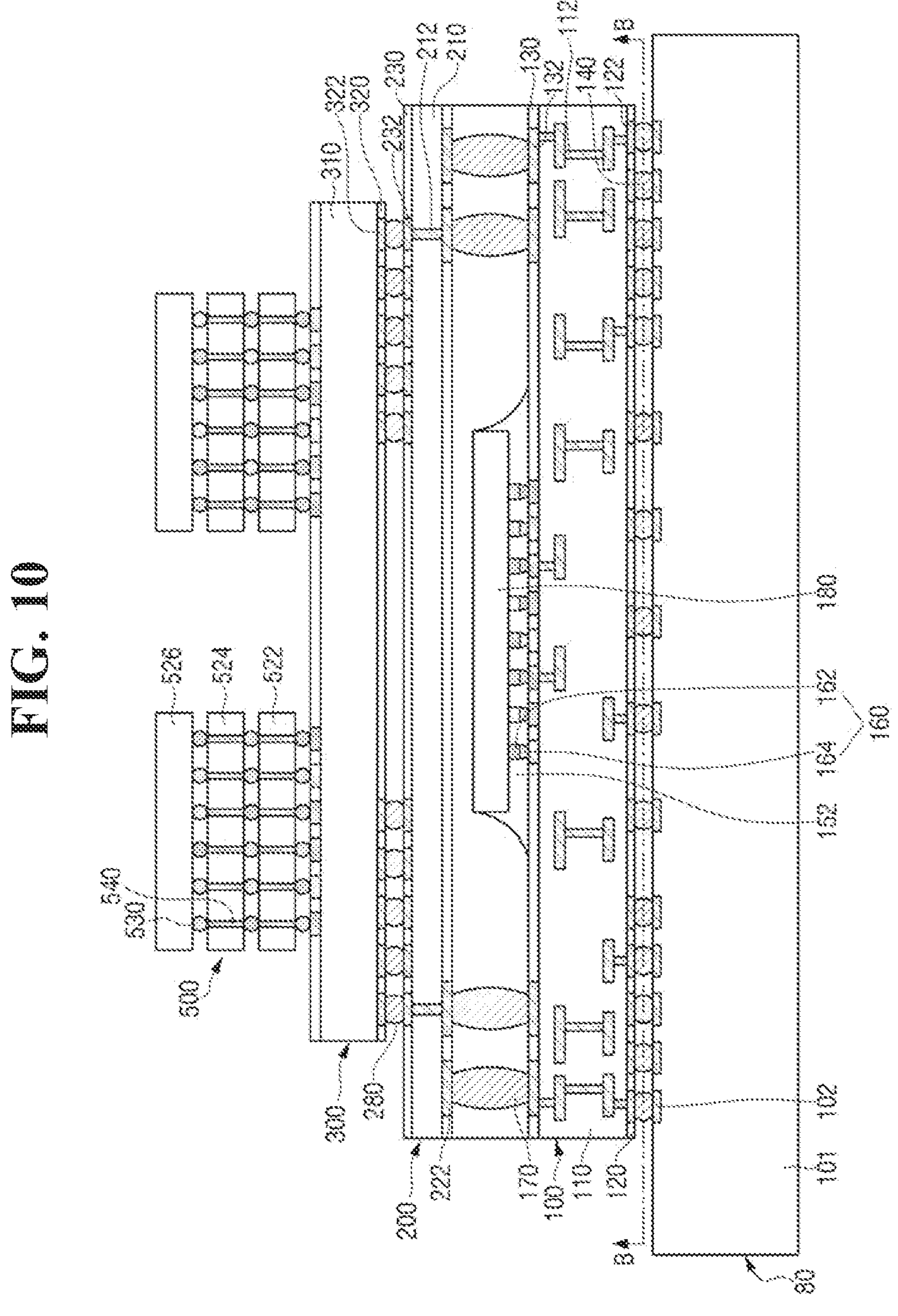
FIG. 10 is an illustrative view for describing a semiconductor package according to an embodiment of the present disclosure.

FIG. 10 is an illustrative view for describing a semiconductor package according to an embodiment. For convenience of explanation, a description of elements that are similar or identical to those described above with reference to embodiments of FIGS. 1 to 4 will be briefly described or omitted.

Referring to FIG. 10, a high bandwidth memory (HBM) 500 may be mounted on the upper surface of the second substrate 300. In an embodiment, the high bandwidth memory 500 may include, for example, a plurality of memory chips 522, 524, and 526. While an embodiment shown in FIG. 10 includes three memory chips, embodiments of the present disclosure are not necessarily limited thereto. The plurality of memory chips 522, 524, and 526 may be sequentially stacked on the interposer 200. In an embodiment, a controller chip may be disposed between the second substrate 300 and the plurality of memory chips 522, 524, and 526.

In an embodiment, the high bandwidth memory 500 may include a third bump 530 and a through via 540. The third bump 530 may be interposed between the plurality of memory chips 522, 524, and 526. The through via 540 may penetrate through at least a portion of the plurality of memory chips 522, 524, and 526 and be connected to the third bump 530. Accordingly, the high bandwidth memory 500 may be electrically connected to the first substrate 100 through the second substrate 300. In an embodiment, the high bandwidth memory 500 may also be electrically connected to the first semiconductor chip 180 through the second substrate 300, the first substrate 100, and the interposer 200.

Figure 11:
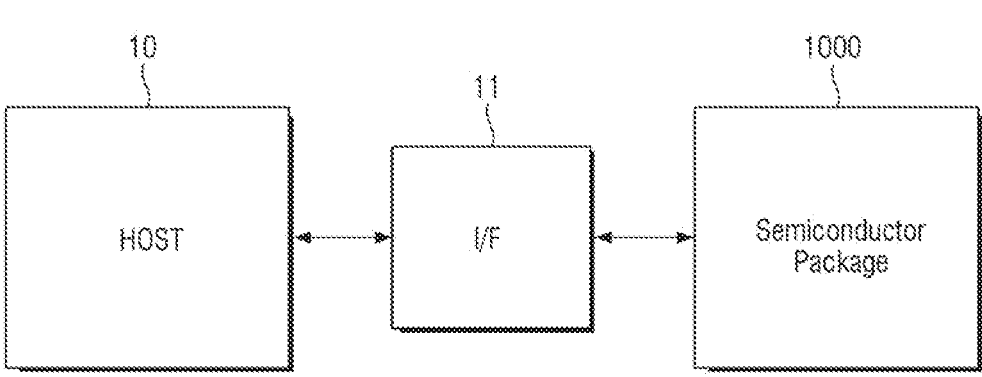
FIG. 11 is a diagram for describing an electronic device according to an embodiment of the present disclosure.
Figure 12:
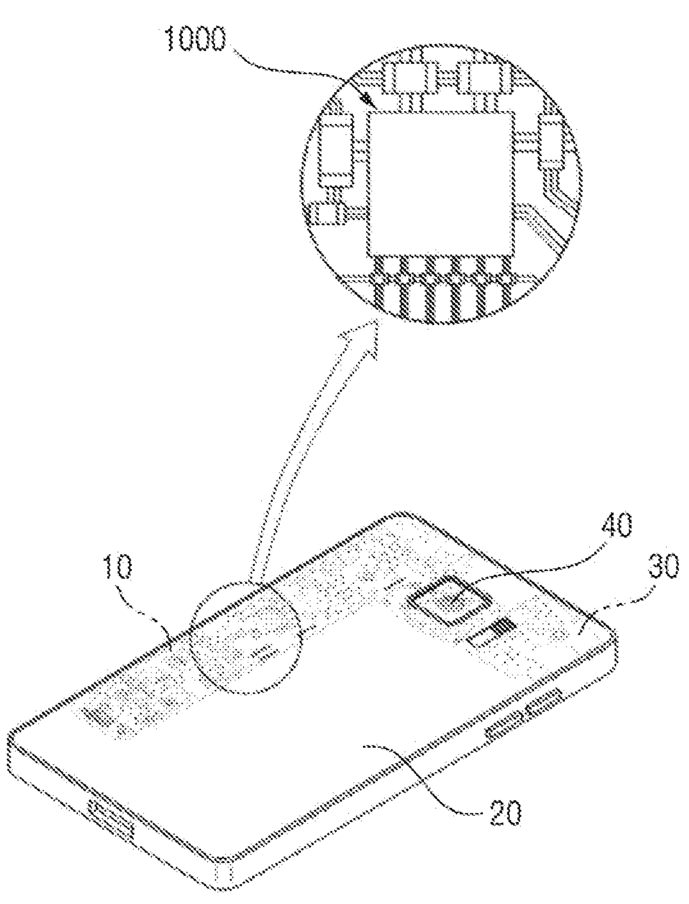
FIG. 12 is a perspective view for describing an electronic device according to an embodiment of the present disclosure.

FIG. 11 is a diagram for describing an electronic device according to an embodiment. FIG. 12 is a perspective view for describing an electronic device according to an embodiment.

Referring to FIG. 11, an electronic device 1 may include a host 10, an interface 11, and a semiconductor package 1000.

In an embodiment, the host 10 may be connected to the semiconductor package 1000 through the interface 11 (I/F) For example, the host 10 may transmit a signal to the semiconductor package 1000 and control the semiconductor package 1000. In addition, for example, the host 10 may receive a signal from the semiconductor package 1000 and process data included in the signal.

For example, in an embodiment the host 10 may include a central processing unit (CPU), a controller, or an application specific integrated circuit (ASIC). In addition, for example, the host 10 may include memory chips such as a dynamic random access memory (DRAM), a static RAM (SRAM), a phase-change RAM (PRAM), a magneto resistive RAM (MRAM), a ferroelectric RAM (FeRAM), and a resistive RAM (RRAM). However, embodiments of the present disclosure are not necessarily limited thereto.

Referring to FIGS. 11 and 12, the electronic device 1 may include a host 10, a body 20, a main board 30, a camera module 40, and a semiconductor package 1000.

The main board 30 may be mounted in the body 20 of the electronic device 1. The host 10, the camera module 40, and the semiconductor package 1000 may be mounted on the main board 30. The host 10, the camera module 40, and the semiconductor package 1000 may be electrically connected by the main board 30. For example, the interface 11 may be implemented by the main board 30.

The host 10 and the semiconductor package 1000 may be electrically connected by the main board 30 to exchange signals.

Although embodiments of the present disclosure have been described with reference to the accompanying drawings, the present disclosure is not limited to the above embodiments, but may be implemented in various different forms. Therefore, it should be appreciated that the embodiments as described above is not restrictive but illustrative in all respects.

What is claimed is:

1. A semiconductor package comprising:

a first substrate including a first surface extending in a first direction and a second surface extending in a second direction;

solder balls disposed on a lower surface of the first substrate; and a first semiconductor chip on an upper surface of the first substrate, wherein the solder balls include:

a first ball disposed in the first direction from a center of the first substrate, the first ball is spaced apart from the center of the first substrate by a first distance, and a second ball disposed in a third direction from the center of the first substrate, the third direction is between the first and second directions, the second ball is spaced apart from the center of the first substrate by a second distance, a first pitch between the first ball and a first adjacent ball disposed immediately adjacent to an outer side of the first ball in the first direction is less than a second pitch between the first ball and a second adjacent ball disposed immediately adjacent to an inner side of the first ball in the first direction, the second ball is spaced apart from a third adjacent ball disposed immediately adjacent to the outer side of the second ball in the first direction by the first pitch, and the first distance is greater than or equal to the second distance.

2. The semiconductor package of claim 1, wherein a pitch between the second ball and a fourth adjacent ball disposed immediately adjacent to an outer side of the second ball in the third direction and a pitch between the second ball and a fifth adjacent ball disposed immediately adjacent to an inner side of the second ball in the third direction are both a third pitch.

3. The semiconductor package of claim 2, wherein the second pitch is greater than the third pitch.

4. The semiconductor package of claim 2, wherein the third pitch is greater than the first pitch.

5. The semiconductor package of claim 1, further comprising:

a third ball disposed in the second direction from the center of the first substrate, the third ball is spaced apart from the center of the first substrate by the first distance, wherein a fourth pitch between the third ball and a sixth adjacent ball disposed immediately to an outer side of the third ball in the second direction is less than a fifth pitch between the third ball and a seventh adjacent ball disposed immediately adjacent to an inner side of the third ball in the second direction.

6. The semiconductor package of claim 5, wherein the second pitch and the fifth pitch are equal to each other.

7. The semiconductor package of claim 1, wherein a virtual circle having a first radius from the center of the first substrate includes the first ball and the second ball.

8. The semiconductor package of claim 1, wherein an angle formed by the third direction and the first direction is about 45°.

9. The semiconductor package of claim 1, wherein:

the solder balls include a first ball group passing through the center of the first substrate, the first ball group is arranged in the first direction; and the first ball group includes a plurality of first sub-balls spaced apart from each other by the second pitch.

10. The semiconductor package of claim 9, wherein:

the solder balls include a second ball group passing through the center of the first substrate, the second ball group is arranged in the third direction; and the second ball group includes a plurality of second sub-balls spaced apart from each other by a third pitch.

11. The semiconductor package of claim 10, wherein a number of the plurality of first sub-balls is greater than or equal to a number of the plurality of second sub-balls.

12. A semiconductor package comprising:

a first substrate including a first surface extending in a first direction and a second surface extending in a second direction;

solder balls disposed on a lower surface of the first substrate; and a first semiconductor chip on an upper surface of the first substrate, wherein the solder balls include:

a first ball group passing through a center of the first substrate, the first ball group including first sub-balls aligned at a first pitch in the first direction, and a second ball group passing through a center of the first substrate, the second ball group including second sub-balls aligned at a second pitch in a third direction, the second pitch is less than the first pitch an angle formed by the third direction and the first direction is about 45°, a distance from the center of the first substrate to an outermost first sub-ball is greater than a distance from the center of the first substrate to an outermost second sub-ball, and a distance between the outermost second sub-ball and a first adjacent ball immediately adjacent to an inner side of the outermost second sub-ball in the first direction is the first pitch.

13. The semiconductor package of claim 12, wherein a number of the first sub-balls is greater than or equal to a number of the second sub-balls.

14. The semiconductor package of claim 12, wherein a number of the first sub-balls is less than a number of the second sub-balls.

15. The semiconductor package of claim 12, wherein:

a distance between the outermost second sub-ball and a second adjacent ball immediately adjacent to an outer side of the outermost second sub-ball in the first direction is the first pitch; and a distance between the outermost second sub-ball and a third adjacent ball immediately adjacent to an outer side of the outermost second sub-ball in the second direction is the first pitch.

16. The semiconductor package of claim 12, wherein a distance between the outermost second sub-ball and a second adjacent ball immediately adjacent to an outer side of the outermost second sub-ball in the first direction is different from a distance between the outermost second sub-ball and a third adjacent ball immediately adjacent to an outer side of the outermost second sub-ball in the second direction.

17. The semiconductor package of claim 16, wherein a virtual line including the first ball group and the second ball group has an intersection shape.

18. The semiconductor package of claim 12, further comprising a second substrate disposed on a lower surface of the first substrate, wherein the solder balls electrically connect the first substrate and the second substrate to each other.

19. The semiconductor package of claim 12, further comprising:

an interposer disposed on the first semiconductor chip; and a second semiconductor chip disposed on the interposer, wherein the interposer electrically connects the first substrate and the second semiconductor chip to each other.

20. A semiconductor package comprising:

a first substrate including a first surface extending in a first direction and a second surface extending in a second direction;

solder balls disposed on a lower surface of the first substrate;

a first semiconductor chip on an upper surface of the first substrate;

an interposer disposed on the first semiconductor chip;

a first connection member connecting the interposer and the first substrate to each other;

a second substrate disposed on the first substrate; and a second semiconductor chip on an upper surface of the second substrate, wherein the solder balls include:

a first ball disposed in the first direction from a center of the first substrate, the first ball is spaced apart from the center of the first substrate by a first distance, and a second ball disposed in a third direction from the center of the first substrate, the third direction is between the first and second directions, the second ball is spaced apart from the center of the first substrate by a second distance, a first pitch between the first ball and a first adjacent ball disposed immediately adjacent to an outer side of the first ball in the first direction is less than a second pitch between the first ball and a second adjacent ball disposed immediately adjacent to an inner side of the first ball in the first direction, the second ball is spaced apart from a third adjacent ball disposed immediately adjacent to the outer side of the second ball in the first direction by the first pitch, and the first distance greater than or equal to the second distance.

* * * * *